(12) United States Patent
Nakajo (10) Patent No.: US 6,894,317 B2
(45) Date of Patent: May 17, 2005

(54) SEMICONDUCTOR ELEMENT AND METHOD FOR PRODUCING THE SAME

(75) Inventor: Naoki Nakajo, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/166,364

(22) Filed: Jun. 11, 2002

(65) Prior Publication Data

US 2002/0185647 A1 Dec. 12, 2002

(30) Foreign Application Priority Data

Jun. 11, 2001 (JP) .................................... P2001-175089

(51) Int. Cl.[7] .............................................. H01L 33/00
(52) U.S. Cl. .................................... 257/99; 257/103
(58) Field of Search ............................................ 257/99

(56) References Cited

U.S. PATENT DOCUMENTS 5,798,536 A * 8/1998 Tsutsui ........................ 257/99
6,255,129 B1 * 7/2001 Lin .............................. 438/26

FOREIGN PATENT DOCUMENTS

| JP | 57-004180 | 1/1982 |
|---|---|---|
| JP | 06-268258 | 9/1994 |
| JP | 08-083929 | 3/1996 |
| JP | 08-102549 | 4/1996 |
| JP | 08-255926 | 10/1996 |

* cited by examiner

Primary Examiner—Douglas Wille
(74) Attorney, Agent, or Firm—McGinn & Gibb, PLLC (57) ABSTRACT

A semiconductor element including an electrically insulating substrate, semiconductor layers including first and second semiconductor layers of different conduction types and formed on the electrically insulating substrate, a first electrode formed on the first semiconductor layer, and a second electrode formed on the second semiconductor layer revealed by etching at least the first semiconductor layer, wherein a die-bonding electrode is formed on a side surface of the second electrode, on a side surface of the second semiconductor layer and on a region of from a side surface to a bottom surface of the electrically insulating substrate. Metal-metal contact is formed between the die-bonding electrode and the side surface of the second electrode, so that low-resistance contact is obtained here.

22 Claims, 6 Drawing Sheets

FIG. 11

SEMICONDUCTOR ELEMENT AND METHOD FOR PRODUCING THE SAME

The present application is based on Japanese Patent Application No. 2001-175089, which is incorporated herein by reference.

BACKGROUND OF THE INVENTION

1. Field of the Invention

The present invention relates to improvement in a semiconductor element such as a semiconductor light-emitting element and improvement in a method for producing the semiconductor element.

2. Description of the Related Art

In a Group III nitride compound semiconductor light-emitting element having an electrically insulating substrate such as a sapphire substrate, two electrodes were formed on the front surface side of the substrate because it was impossible to form any electrode on the rear surface side of the substrate. On this occasion, because of the electrodes, the area for light emission was reduced or it was difficult to obtain any isotropic emission pattern. Hence, the electrodes caused an obstacle to the mode of light emission of the light-emitting element. Moreover, it was necessary to apply wire-bonding to two places so that much labor was required for producing the light-emitting element.

To solve this problem, there has been proposed a semiconductor light-emitting element in which the circumference of an electrically insulating substrate is covered with an electrically conductive material so that electrical conduction is secured between an n electrode and a lead (see Japanese Patent Publication No. Hei. 8-102549 and Japanese Patent Publication No. Hei. No. 6-268258).

In the semiconductor light-emitting element disclosed in Japanese Patent Publication No. Hei. 8-102549, rear and side surfaces of a sapphire substrate and side surfaces of semiconductor layers are covered with an electrically conductive reflecting film. The electrically conductive reflecting film comes into contact with a side surface of an n-type layer. For cutting a wafer into semiconductor light-emitting elements, kerfs are formed in semiconductor layers. The circumferential wall of each kerf serves as side surfaces of semiconductor layers of a corresponding light-emitting element. For this reason, the side surface of the n-type layer is generally rough. Hence, even in the case where an electrically conductive material is laminated on the side surface of the n-type layer, it is difficult to obtain sufficient low-resistance contact between the electrically conductive material and the n-type layer.

On the other hand, the semiconductor light-emitting element disclosed in Japanese Patent Publication No. Hei. 8-268258 is designed, so that an inclined surface is formed around a sapphire substrate, an n electrode is formed on an n-type layer on the inclined surface, and electrically conductive paste used for fixing the light-emitting element to a cup type lead intentionally turns around to the n electrode. It is, however, difficult to grow Group III nitride compound semiconductor layers with good crystallinity on the inclined surface of the sapphire substrate. In the current situation, it is impossible to obtain the light-emitting characteristic required of the light-emitting element.

Further, because the chip scale of the light-emitting element is small, it is difficult to fabricate the light-emitting element under the condition that the electrically conductive paste is not brought into contact to the p-type layer or the p electrode.

SUMMARY OF THE INVENTION

This invention is designed to solve the problem and configured as follows.

A semiconductor element having an electrically insulating substrate, a semiconductor layer including first and second semiconductor layers of different conduction types and formed on the electrically insulating substrate, a first electrode formed on the first semiconductor layer, and a second electrode formed on the second semiconductor layer revealed by removing at least a part of the first semiconductor layer, wherein a die-bonding electrode is formed on a side surface of the second electrode, a side surface of the second semiconductor layer and at least one side surface of the electrically insulating substrate.

According to the semiconductor element configured as described above, the semiconductor element fulfills its element characteristic sufficiently because the configuration of the semiconductor element is a configuration of a normal element except the die-bonding electrode. Moreover, because the die-bonding electrode contacts the side surface of the second electrode, metal-metal contact is formed between the die-bonding electrode and the second electrode so that ohmic contact can be secured. Because the die-bonding electrode at least reaches the side surface of the substrate, electrical connection between the side surface of the electrically insulating substrate and a lead can be obtained easily, for example, by making electrically conductive paste turn around to the side surface of the substrate. When the die-bonding electrode turns around to the rear surface of the electrically insulating substrate, electrical connection between the lead and the semiconductor element can be obtained easily and surely.

DETAILED DESCRIPTION OF THE PREFERRED EMBODIMENTS

This invention will be described below more in detail on the basis of a Group III nitride compound semiconductor light-emitting element taken as an example.

Figure 1:
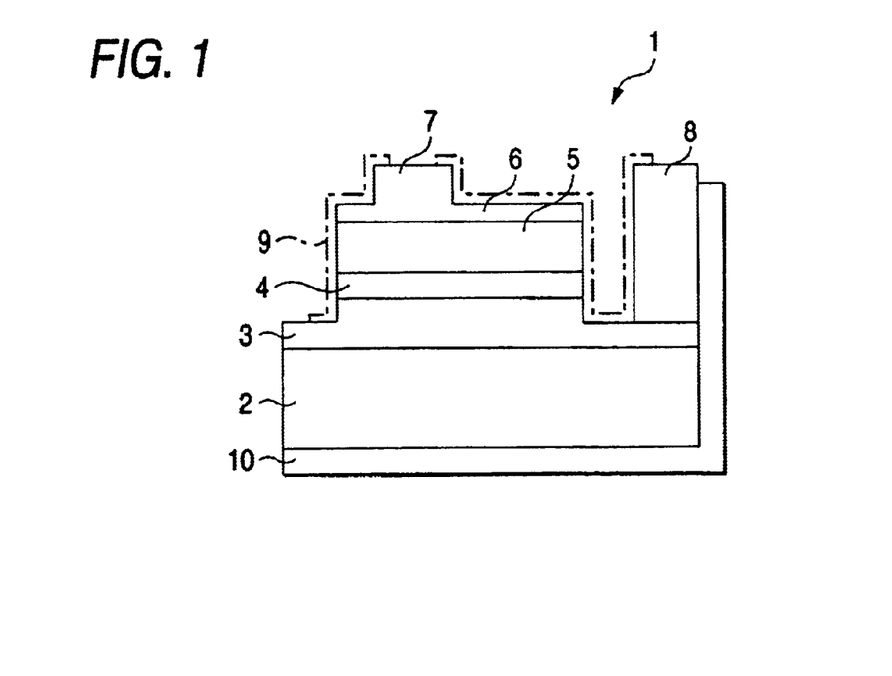
FIG. 1 is a sectional view showing the configuration of a light-emitting element according to a first embodiment of the invention.

For example, as shown in FIG. 1, the Group III nitride compound semiconductor light-emitting element 1 according to the invention has a sapphire substrate (electrically insulating substrate) 2, and semiconductor layers laminated on the substrate 2. The semiconductor layers are formed so that an n-type layer 3 (second semiconductor layer), a light-emitting layer-containing multi-layer 4 and a p-type layer 5 (first semiconductor layer) are laminated successively. A light-transmissive electrode 6 is stuck onto the substantially whole surface of the p-type layer 5. A p electrode 7 (first electrode) is further formed on the light-transmissive electrode 6. An n electrode 8 (second electrode) is formed on the n-type layer 3 revealed by etching. The n electrode 8 is formed on the whole area of one side of the light-emitting element 1. The reference numeral 9 designates a protective film. The configuration is the same as that of a normal light-emitting element. As a result, sufficient light-emitting characteristic can be secured.

The reference numeral 10 designates a die-bonding electrode. A first side surface (right side surface in FIG. 1) of the n electrode 8, a first side surface (right side surface in FIG. 1) of the n-type layer 3, a first side surface (right side surface in FIG. 1) of the sapphire substrate 2 and a bottom surface of the sapphire substrate 2 are covered with the die-bonding electrode 10. Because metal-metal contact is formed between the die-bonding electrode 10 and the first side surface of the n electrode 8, low-resistance contact is obtained here. The die-bonding electrode 10 and the n electrode 8 are preferably formed of one metal or one kind of metal. This arrangement is made for securing low-resistance contact and obtaining sufficient mechanical bonding force between the die-bonding electrode 10 and the n electrode 8.

Incidentally, in this specification, the Group III nitride compound semiconductors are represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_XGa_{1-X}N$, $Al_XIn_{1-X}N$ and $Ga_XIn_{1-X}N$ ($0<x<1$). The group III elements may be at least partially replaced by boron (B), thallium (Tl), etc. The nitrogen (N) may be at least partially replaced by phosphorus (P), arsenic (As), antimony (Sb), bismuth (Bi), etc. Each of the Group III nitride compound semiconductors may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities, the Group III nitride compound semiconductor may be subjected to electron beam irradiation, plasma irradiation or heating in a furnace. This step is not always essential. The method for forming the Group III nitride compound semiconductor layers is not particularly limited. For example, the Group III nitride compound semiconductor layers may be formed by a metal organic chemical vapor deposition method (MOCVD method) or may be formed by an a known method such as a molecular beam epitaxy method (MBE method), a halide vapor phase epitaxy method (HVPE method), a sputtering method, an ion-plating method, or an electron shower method.

Incidentally, a homostructure, a heterostructure or a double heterostructure may be used as the structure of the light-emitting element. A quantum well structure (single quantum well structure or multiple quantum well structure) may be also used as the structure of the light-emitting element.

The configuration of the invention will be described below more in detail with reference to embodiments thereof.

First Embodiment

Figure 2:
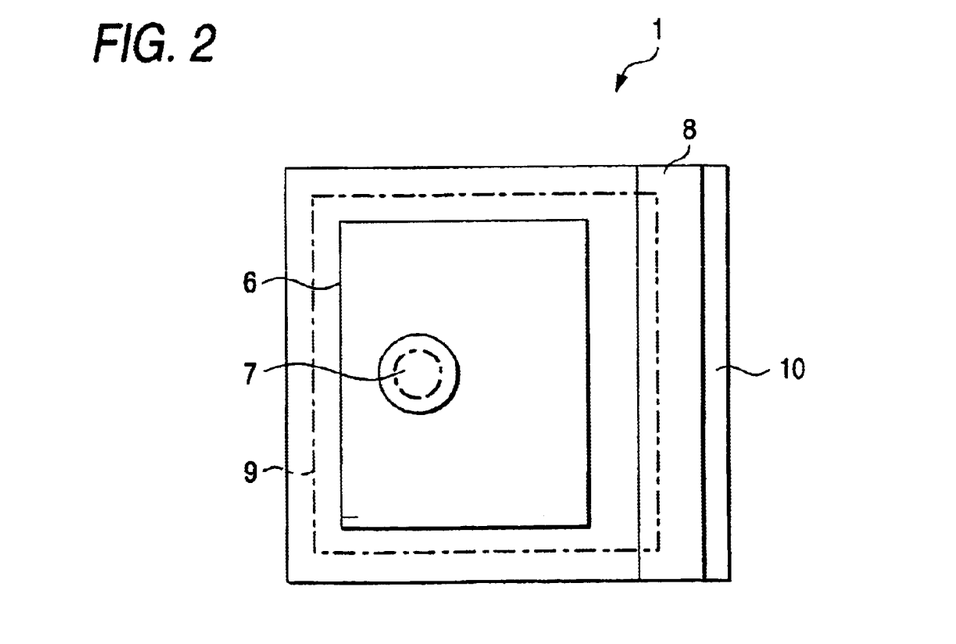
FIG. 2 is a plan view showing the same configuration.

FIGS. 1 and 2 are a sectional view and a plan view showing the configuration of a light-emitting element 1 according to this embodiment.

The configuration shown in FIG. 1 has been already described. In this embodiment, the p electrode 7 is made of a gold alloy and the n electrode 8 is made of an aluminum alloy. The die-bonding electrode 10 is also made of an aluminum alloy in order to improve bonding between the die-bonding electrode 10 and the n electrode 8.

Any material may be used as the material of the die-bonding electrode 10 if the material is electrically conductive and can secure sufficient low-resistance contact between the die-bonding electrode 10 and the n electrode 8.

As will be described later (see FIG. 8), an electrode side surface of the light-emitting element 1 is bonded to a sheet when the die-bonding electrode 10 is formed (by vapor deposition). In this state, the n electrode 8 is preferably disposed in the whole area of one side (in the direction of vapor deposition of the material) of the light-emitting element 1 and has a height sufficient to contact the sheet so that the die-bonding electrode 10 is preferably formed so that the material of the die-bonding electrode 10 does not turn around to the upper surface of the light-emitting element 1.

The width of then electrode 8 is not particularly limited but a contact area of about 10,000 $\mu m^2$ is required between the n electrode 8 and the n-type layer 3.

Second Embodiment

Figure 3:
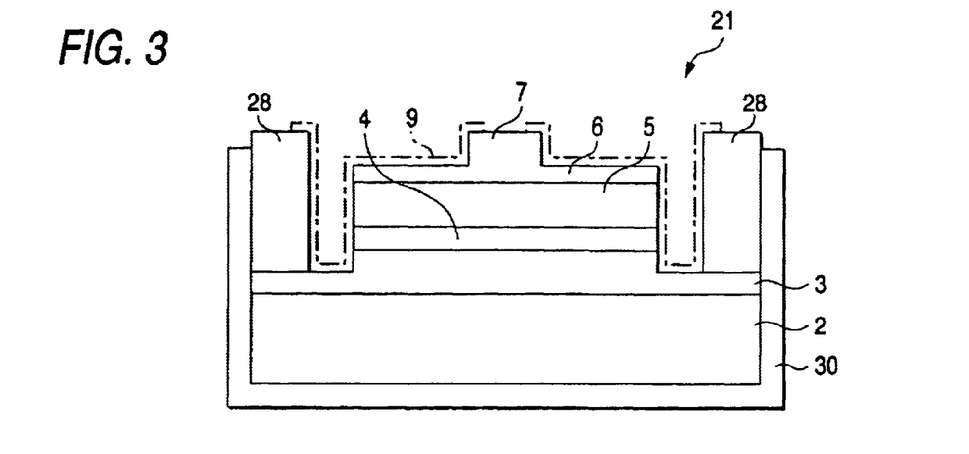
FIG. 3 is a sectional view showing the configuration of a light-emitting element according to a second embodiment.
Figure 4:
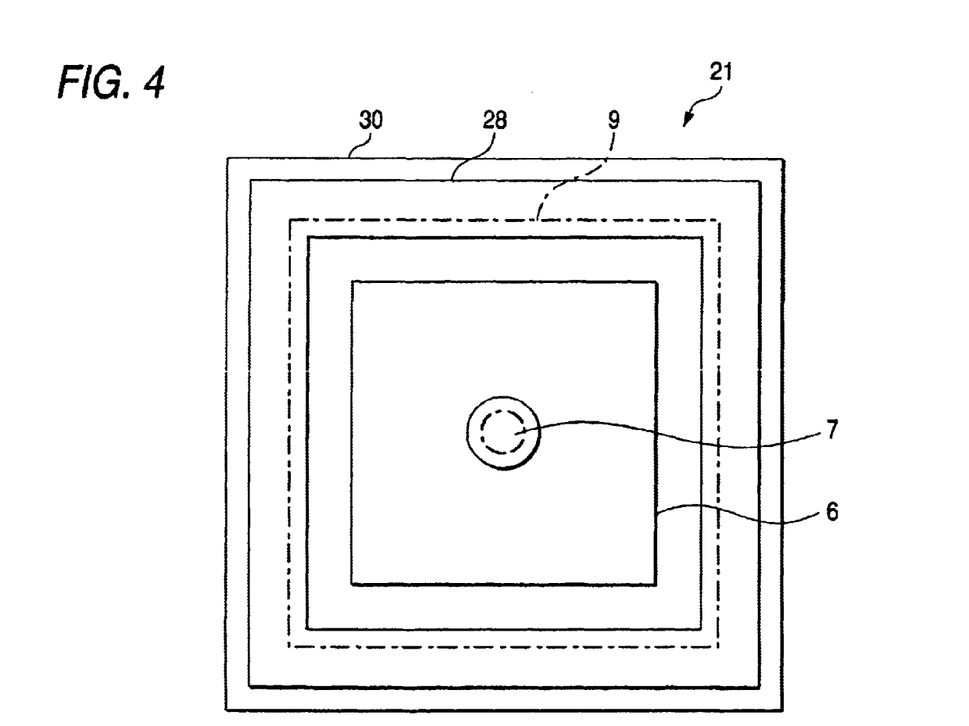
FIG. 4 is a plan view showing the same configuration.

FIGS. 3 and 4 show a light-emitting element 21 as another embodiment. Incidentally, members the same as those in the first embodiment are referenced correspondingly, and the description of these members is omitted.

This embodiment is the same as the first embodiment except that the n electrode 28 is formed on the whole circumference of the light-emitting element 21 and that the die-bonding electrode 30 is also formed on the whole side surface of the light-emitting element 21 and on the rear surface of the sapphire substrate 2. Because the n electrode 28 is formed on the whole circumference of the light-emitting element 21, the near-field light-emitting pattern is improved more uniform than the near-field light-emitting pattern according to the first embodiment, and the material of the die-bonding electrode can be prevented more steadily from turning around to the upper surface of the light-emitting element except n electrode and n-type layer.

The method for producing the light-emitting element will be described below in connection with the example of the light-emitting element 21 shown in FIGS. 3 and 4.

Figure 5:
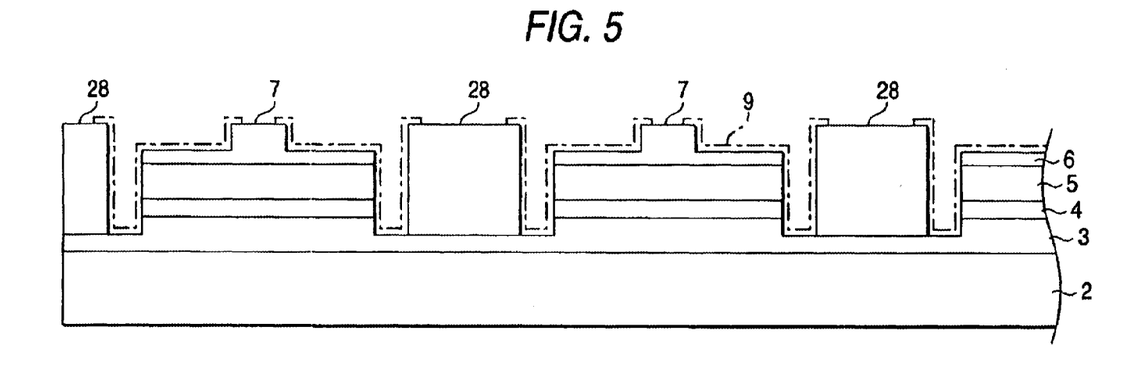
FIG. 5 is a sectional view showing a wafer state in production of the light-emitting element according to the second embodiment.

First, as shown in FIG. 5, semiconductor layers 3, 4 and 5 are epitaxially grown on a sapphire substrate 2 (wafer) by a general MOCVD method. Then, the p-type layer 5, the multi-layer 4 and a part of the n-type layer 3 are etched to thereby reveal a surface on which an n electrode 28 will be formed. A light-transmissive electrode 6 made of a gold alloy and a p electrode 7 made of a gold alloy are formed successively on the p-type layer 5 by vacuum evaporation. An n electrode 28 made of an aluminum alloy is further formed by vacuum evaporation so that the height of the n electrode 28 is substantially equal to that of the p electrode 7. Then, a protective film 9 made of silicon dioxide is formed to attain both electrical insulation between the electrodes and protection of the surface of the light-emitting element.

Figure 6:
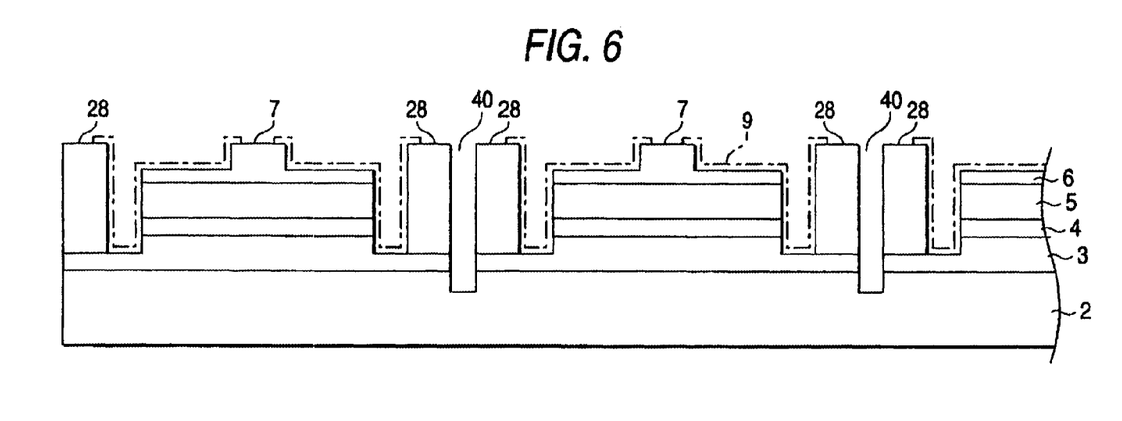
FIG. 6 is a sectional view showing a state in which kerfs are formed in the wafer.

Then, as shown in FIG. 6, the wafer is diced up to a depth reaching the substrate 2 in portions of the n electrode 28 to thereby form kerfs 40. Then, the rear surface of the substrate 2 is polished by a turn table to thereby reduce the thickness of the substrate 2. When the substrate 2 obtained thus as a thin plate is viewed from its rear side, the kerfs 40 can be visually recognized (pretreatment step).

Figure 7:
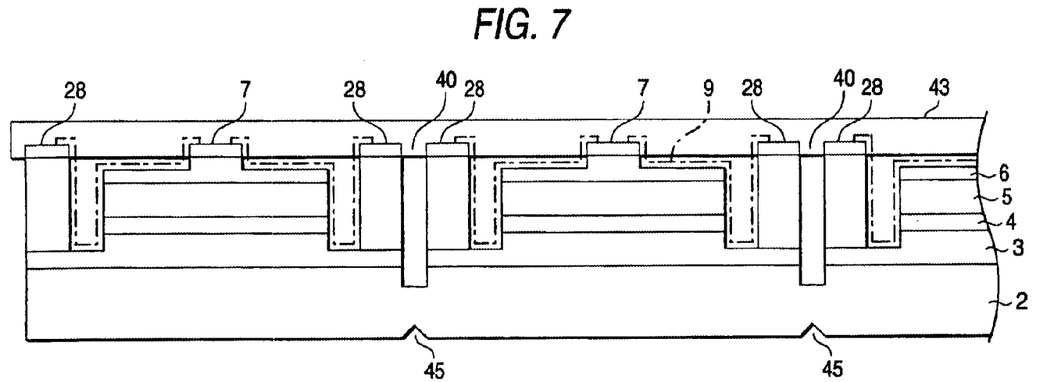
FIG. 7 is a sectional view showing a state in which a wafer is stuck to an adhesive sheet.

Then, the electrode-forming surface of the wafer is stuck to an adhesive sheet 43 to thereby obtain the configuration shown in FIG. 7 (sheet sticking step). Incidentally, the adhesive sheet 43 is supported by a support ring not shown.

Then, the rear surface of the substrate 2 is scribed along the kerfs 40 by a scriber to thereby form scribe-lines 45.

Then, loading is applied on the scribe-lines 45 by a breaking machine to thereby separate the wafer into chips (light-emitting elements). In addition, the adhesive sheet 43 is expanded evenly in the planar direction to thereby obtain the configuration shown in FIG. 8 (separating step). The chip interval is preferably selected to be not smaller than a half of the thickness of each light-emitting element, more preferably not smaller than the thickness of each light-emitting element.

Figure 8:
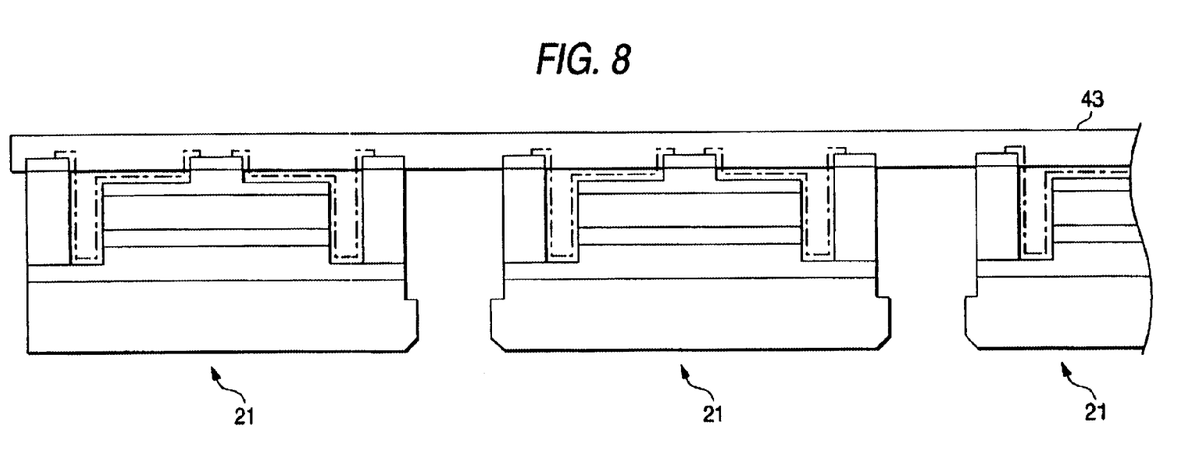
FIG. 8 is a sectional view showing a state in which the adhesive sheet is expanded so that the wafer is separated into chips and in which a material of a die-bonding electrode will be formed from a location obliquely below each chip by vacuum evaporation.

Then, the configuration shown in FIG. 8 is carried into a vacuum evaporation apparatus. In the vacuum evaporation apparatus, a die-bonding electrode 30 is formed on the whole side surface and the rear surface of each chip while the adhesive sheet 43 is inclined at a predetermined angle to the direction of vacuum evaporation of the material and is rotated. In this embodiment, the same material as the material of the n electrode 28 is used as the material of the die-bonding electrode 30. Although the thickness of the die-bonding electrode 30 is selected to be about 10 μm in this embodiment, the thickness of the die-bonding electrode 30 is not particularly limited.

The die-bonding electrode 30 may be formed by another method such as sputtering or spray coating.

Then, respective chips are released from the adhesive sheet 43 to thereby obtain light-emitting elements 21 shown in FIGS. 3 and 4.

According to the light-emitting element 21 thus formed, the rear surface of the sapphire substrate 2 can be electrically connected to a lead by the die-bonding electrode 30. Hence, in the upper surface (light-emitting surface) of the light-emitting element, there is no necessity except that an electrically conductive wire is suspended only from the p electrode 7, so that the workability is improved.

Incidentally, in the light-emitting element shown in FIGS. 1 and 2, when the adhesive sheet is expanded, the quantity of expansion in a direction opposite to the n electrode 28 (that is, in a direction perpendicular to the paper plane in FIG. 3) is preferably reduced to prevent the die-bonding material from turning around to the upper surface of the light-emitting element.

Figure 9:
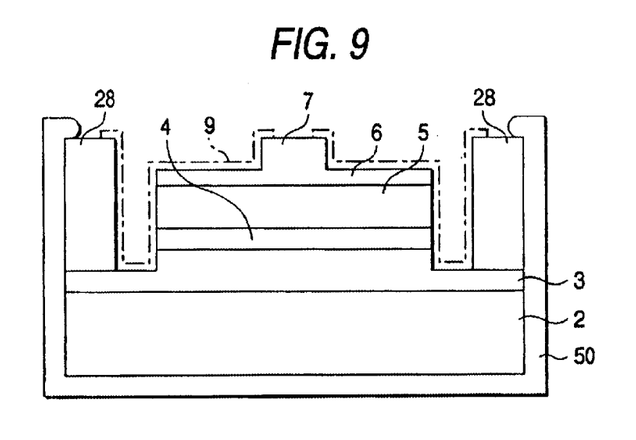
FIG. 9 is a sectional view showing the configuration of a light-emitting element as a modified example of the second embodiment.

Alternatively, in a state shown in FIG. 8, respective chips 21 may be released from the adhesive sheet 43 so that die-bonding materials can be formed by vacuum evaporation on the chips from the rear surfaces of the chips respectively. In this case, each die-bonding material turns around to the upper surface of the n electrode 28 (see FIG. 9), and lower-resistance contact can be secured between the n electrode 28 and the die-bonding electrode 50. The lower-resistance is preferred.

Figure 10:
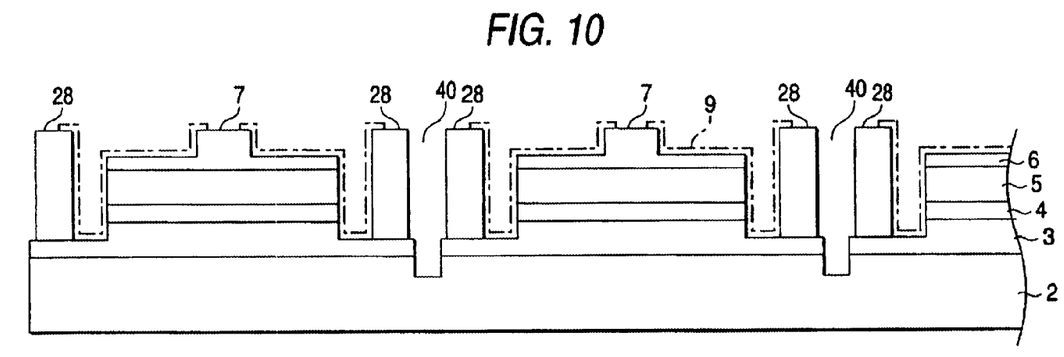
FIG. 10 is a sectional view showing a modified example of the wafer.
Figure 11:
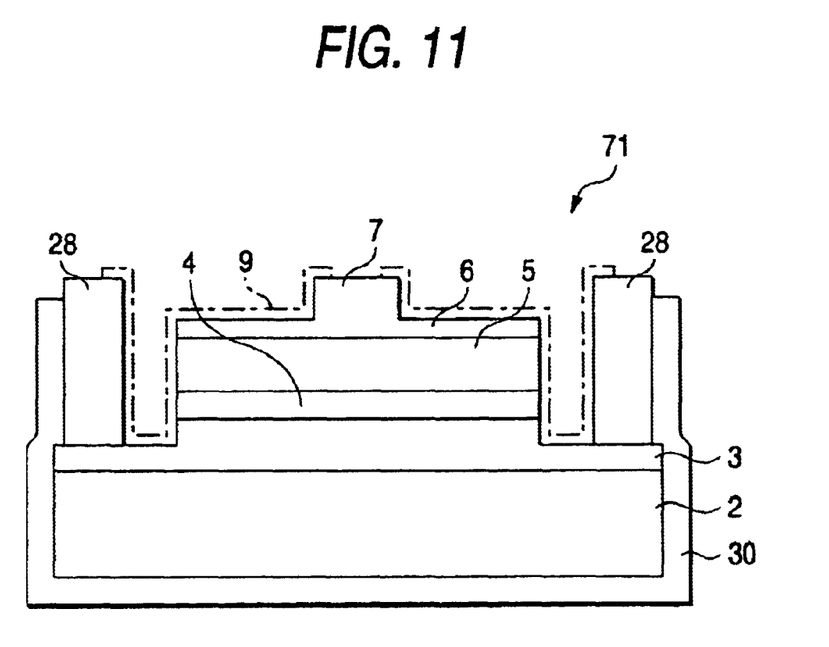
FIG. 11 is a sectional view showing the configuration of a light-emitting element as another modified example of the second embodiment.

Although the embodiments have shown the case where each kerf 40 is formed in the n electrode 28 as shown in FIG. 6, the invention may be applied also to the case where the n electrode 28 is not formed in the position where the kerf will be formed. A typical view corresponding to FIG. 6 in this case is shown in FIG. 10. The light-emitting element 71 obtained thus is shown in FIG. 11. In FIGS. 10 and 11, members the same as those in FIGS. 3 and 6 are referenced correspondingly and the description of these members is omitted.

The invention is not limited at all to the description on the embodiments of the invention. The invention includes various modifications that can be conceived easily by those skilled in the art, without departing from the description of the scope of claim.

What is claimed is:

1. A semiconductor element, comprising:

an electrically insulating substrate;

a semiconductor layer, including first and second semiconductor layers of different conduction types, formed on said electrically insulating substrate;

a first electrode formed on said first semiconductor layer; and a second electrode formed on said second semiconductor layer revealed by removing a part of said first semiconductor layer, wherein said second electrode is formed on an upper surface of said second semiconductor layer, and wherein a die-bonding electrode is formed on a side surface of said second electrode, a side surface of said second semiconductor layer, and a side surface of said electrically insulating substrate.

2. A semiconductor element according to claim 1, wherein said second electrode is formed in a circumference around said second semiconductor layer, and said die-bonding electrode covers a circumference including said side surface of said second electrode, said side surface of said second semiconductor layer, and said side surface of said electrically insulating substrate.

3. A semiconductor element according to claim 1, wherein said die-bonding electrode extends to cover a rear surface of said electrically insulating substrate.

4. A semiconductor element according to claim 1, wherein said semiconductor layer includes a Group III nitride compound semiconductor and a light-emitting layer.

5. A semiconductor element according to claim 1, wherein a light-emitting layer is interposed between said first semiconductor layer and said second semiconductor layer.

6. A semiconductor element, comprising:

an electrically insulating substrate;

a semiconductor layer, including first and second semiconductor layers of different conduction types, formed on said electrically insulating substrate;

a first electrode formed on said first semiconductor layer; and a second electrode formed on said second semiconductor layer revealed by removing a part of said first semiconductor layer, wherein a die-bonding electrode is formed on a side surface of said second electrode, a side surface of said second semiconductor layer, and a side surface of said electrically insulating substrate, and wherein said die-bonding electrode is formed on an upper surface of said second electrode.

7. A semiconductor element according to claim 1, wherein said second electrode comprises an electrically conductive material.

8. A semiconductor element according to claim 7, wherein said second electrode comprises at least one of a metal and a metal alloy.

9. A semiconductor element according to claim 1, wherein said die-bonding electrode comprises an electrically conductive material.

10. A semiconductor element according to claim 9, wherein said die-bonding electrode comprises at least one of a metal and a metal alloy.

11. A semiconductor element according to claim 1, wherein said second electrode and said die-bonding electrode comprise the same material.

12. A semiconductor element, comprising:

an electrically insulating substrate;

a first semiconductor layer of a first conduction type formed on said electrically insulating substrate;

a first electrode formed on an upper surface of said first semiconductor layer; and a die-bonding electrode formed on a side surface of said first electrode, a side surface of said first semiconductor layer, and a side surface of said electrically insulating substrate, wherein said first electrode and said die-bonding electrode comprise the same electrically conductive material.

13. A semiconductor element according to claim 12, further comprising:

a second semiconductor layer of a second conduction type formed on a part of said first semiconductor layer other than where said first electrode is formed.

14. A semiconductor element according to claim 12, wherein said first electrode is formed in a circumference around said first semiconductor layer.

15. A semiconductor element according to claim 14, wherein said die-bonding electrode is formed as a circumference that covers said side surface of said first electrode, said side surface of said first semiconductor layer, and said side surface of said electrically insulating substrate.

16. A semiconductor element according to claim 13, further comprising:

a light-emitting layer interposed between said first semiconductor layer and said second semiconductor layer.

17. A semiconductor element according to claim 12, wherein said die-bonding electrode extends to cover a rear surface of said electrically insulating substrate.

18. A semiconductor element, comprising:

an electrically insulating substrate;

a semiconductor layer, including first and second semiconductor layers of different conduction types, formed on said electrically insulating substrate;

a first electrode formed on said first semiconductor layer; and a second electrode formed on said second semiconductor layer revealed by removing a part of said first semiconductor layer, wherein a die-bonding electrode is formed on a side surface of said second electrode, a side surface of said second semiconductor layer, and a side surface of said electrically insulating substrate, and wherein said second electrode is formed on an upper surface of said second semiconductor layer revealed by removing a part of said first semiconductor layer.

19. A semiconductor element according to claim 1, wherein metal—metal contact is formed between said die-bonding electrode and said second electrode.

20. A semiconductor element according to claim 19, wherein ohmic contact is securable between said die-bonding electrode and said second electrode.

21. A semiconductor element according to claim 12, wherein metal—metal contact is formed between said die-bonding electrode and said first electrode.

22. A semiconductor element according to claim 21, wherein ohmic contact is securable between said die-bonding electrode and said first electrode.

* * * * *